United States Patent
Zheng et al.

(10) Patent No.: US 10,134,958 B2
(45) Date of Patent: Nov. 20, 2018

(54) PHOSPHOR LAYER, WAVELENGTH CONVERTER, PROJECTOR, AND LIGHTING DEVICE

(71) Applicant: PANASONIC INTELLECTUAL PROPERTY MANAGEMENT CO., LTD., Osaka (JP)

(72) Inventors: Ran Zheng, Osaka (JP); Toshio Mori, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/730,477

(22) Filed: Oct. 11, 2017

(65) Prior Publication Data

US 2018/0108814 A1    Apr. 19, 2018

(30) Foreign Application Priority Data

Oct. 13, 2016    (JP) .................... 2016-201715

(51) Int. Cl.
*H01L 33/50* (2010.01)
*H01S 5/00* (2006.01)
*G03B 21/20* (2006.01)
*H01S 5/323* (2006.01)
*H01S 5/40* (2006.01)

(52) U.S. Cl.
CPC ............ *H01L 33/502* (2013.01); *H01S 5/005* (2013.01); *H01S 5/0092* (2013.01); *G03B 21/204* (2013.01); *H01S 5/32341* (2013.01); *H01S 5/4025* (2013.01)

(58) Field of Classification Search
None
See application file for complete search history.

(56) References Cited

U.S. PATENT DOCUMENTS

2016/0077415 A1    3/2016    Motoya et al.

FOREIGN PATENT DOCUMENTS

JP    2016-058638 A    4/2016

*Primary Examiner* — Moazzam Hossain
*Assistant Examiner* — Hajar Kolahdouzan
(74) *Attorney, Agent, or Firm* — McDermott Will & Emery LLP

(57) ABSTRACT

A phosphor layer contains phosphor particles, and satisfies the following relations: $y \geq 0.0623x^2 + 0.2107x + 28.789$ and $y \leq -0.1172x^2 + 7.584x + 81.148$ where x represents the average particle size (μm) of the phosphor particles, and y represents the thickness (μm) of the phosphor layer.

8 Claims, 6 Drawing Sheets

PHOSPHOR LAYER, WAVELENGTH CONVERTER, PROJECTOR, AND LIGHTING DEVICE

BACKGROUND

1. Technical Field

The present disclosure relates to a phosphor layer, and also to a wavelength converter, a projector, and a lighting device each including the layer.

2. Description of the Related Art

In conventional projectors and lighting devices, excitation light from a solid-state light source, such as a semiconductor laser or a light emitting diode is wavelength-converted by a phosphor layer in a wavelength converter, thereby producing light of desired color. One such wavelength converter is that of PTL 1 which includes a phosphor layer made of aggregated phosphor particles.

CITATION LIST

Patent Literature

PTL 1: Japanese Unexamined Patent Application Publication No. 2016-58638

SUMMARY

Technical Problem

In order to achieve a projector or lighting device with high luminosity, it is preferable that the wavelength converter should have a phosphor layer with high wavelength conversion efficiency. However, it is not easy to achieve such a phosphor layer.

Objects of the present disclosure are to provide a phosphor layer with high wavelength conversion efficiency, and a wavelength converter including the layer. Other objects of the present disclosure are to provide a projector and a lighting device that provide high luminosity.

Solution to Problem

An aspect of the present disclosure is a phosphor layer containing phosphor particles. The phosphor layer satisfies the following relations: $y \geq 0.0623x^2 + 0.2107x + 28.789$ and $y \leq -0.1172x^2 + 7.584x + 81.148$, where x represents the average particle size (μm) of the phosphor particles, and y represents the thickness (μm) of the phosphor layer.

Another aspect of the present disclosure is a wavelength converter including the above-mentioned phosphor layer.

Another aspect of the present disclosure is a projector including the above-mentioned wavelength converter.

Another aspect of the present disclosure is a lighting device including the above-mentioned wavelength converter.

Advantageous Effects of Disclosure

The phosphor layer according to the present disclosure has high wavelength conversion efficiency because it satisfies the relations: $y \geq 0.0623x^2 + 0.2107x + 28.789$ and $y \leq -0.1172x^2 + 7.584x + 81.148$.

The wavelength converter according to the present disclosure has high wavelength conversion efficiency because it includes the above-mentioned phosphor layer. The projector and the lighting device according to the present disclosure have high luminosity because they include the above-mentioned wavelength converter.

DETAILED DESCRIPTION

Exemplary embodiments of a phosphor layer, a wavelength converter, a projector, and a lighting device according to the present disclosure will now be described with reference to drawings. The following embodiments are only examples, and the present disclosure is not limited to the phosphor layer, the wavelength converter, the projector, or the lighting device shown in these embodiments.

In the following exemplary embodiments, the description of well-known matter and of substantially the same configuration as described earlier may be omitted to avoid redundancy and help those skilled in the art understand them easily.

First Exemplary Embodiment

Phosphor Layer 15 and Wavelength Converter 10

Figure 1:
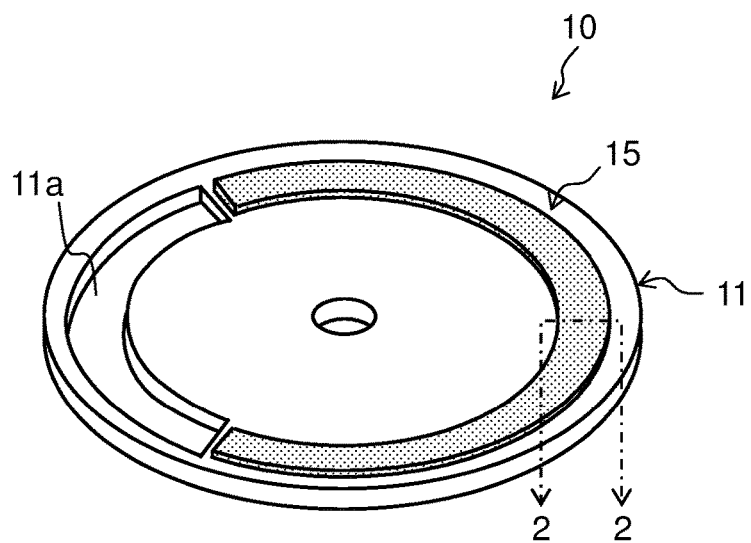
FIG. 1 is a perspective view of a wavelength converter including a phosphor layer according to a first exemplary embodiment.

FIG. 1 is a perspective view of wavelength converter 10 including phosphor layer 15 according to the first exemplary embodiment. In FIG. 1, wavelength converter 10 is a phosphor wheel for used in projectors, and includes disk-shaped substrate 11 and arc-shaped phosphor layer 15 on a main surface (upper surface) of substrate 11. Substrate 11 has arc-shaped opening 11a. Opening 11a and phosphor layer 15, both are arc-shaped, together form a ring. When later-described solid-state light sources 111a emit excitation light to wavelength converter 10, part of the light passes through substrate 11 by way of opening 11a.

Figure 2:
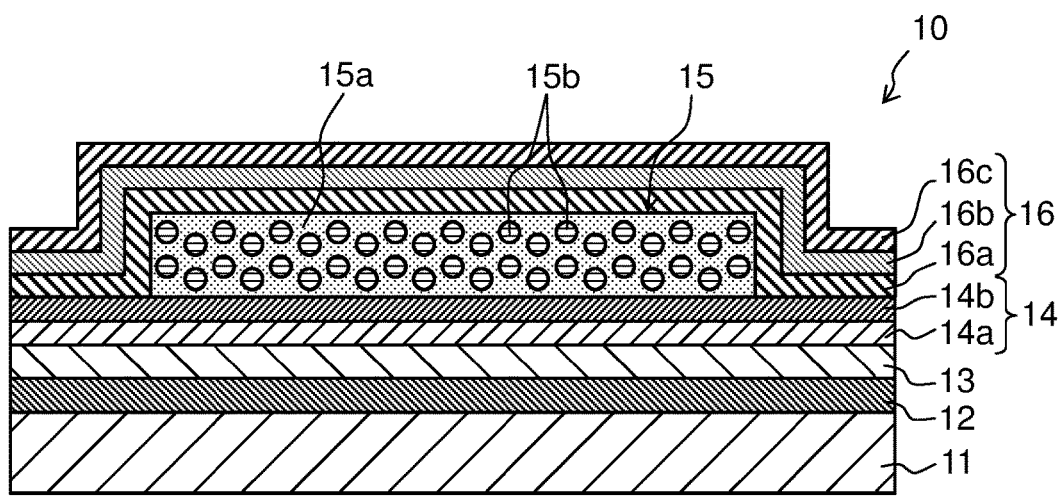
FIG. 2 is a cross sectional view of the wavelength converter including the phosphor layer according to the first exemplary embodiment taken along line 2-2 of FIG. 1.

FIG. 2 is a cross sectional view of wavelength converter 10 according to the first exemplary embodiment taken along line 2-2 of FIG. 1. As shown in FIG. 2, wavelength converter 10 includes substrate 11, adhesive layer 12, metal reflective layer 13, enhanced reflection layer 14, phosphor layer 15, and antireflective layer 16. These layers 12, 13, 14, 15, and 16 are formed in this order on substrate 11.

Substrate 11 has the functions of supporting phosphor layer 15 and of dissipating the heat generated in phosphor layer 15 to the outside. Examples of materials of substrate 11 include glass, quartz, gallium nitride (GaN), sapphire, silicon, and resin. Examples of the resin include polyethylene naphthalate (PEN) and polyethylene terephthalate (PET).

Adhesive layer 12 has the function of improving the adhesiveness of reflective layer 13 to substrate 11. Layer 12 is made of, for example, titanium (Ti) and is formed on the entire upper surface of substrate 11. Layer 12 is not essential in the present exemplary embodiment.

Metal reflective layer 13 has the function of reflecting excitation light that has passed through phosphor layer 15 and/or fluorescence emitted from phosphor layer 15 toward substrate 11 (downward) to the opposite side (upward). In the present exemplary embodiment, metal reflective layer 13 is made of Ag and is formed on the entire upper surface of adhesive layer 12. Alternatively, layer 13 may be made of Al or other metals; however, Ag is preferable because of its high reflectivity. Layer 13 is not essential in the present exemplary embodiment.

Enhanced reflection layer 14 has the functions of reducing optical scattering loss in the interface between metal reflective layer 13 and antireflective layer 16, and of preventing a reduction in reflectivity due to the angular dependence of the incident light. Layer 14 is formed in the entire region of layer 13, or in other words, on the entire upper surface of layer 13. Layer 14 is not essential in the present exemplary embodiment.

Enhanced reflection layer 14 is a multi-layer film composed of alternately laminated low refractive layers and high refractive layers. In the present exemplary embodiment, layer 14 is composed of two layers: low refractive layer 14a and high refractive layer 14b formed in this order from the substrate 11 side. Alternatively, however, layer 14 may include additional layers besides layers 14a and 14b as long as it is a multi-layer film composed of alternately laminated low and high refractive layers.

Examples of materials of low refractive layer 14a include oxides such as silicon dioxide ($SiO_2$) and aluminum oxide ($Al_2O_3$): and nitrides such as aluminum nitride (AlN), aluminum gallium nitride (AlGaN), and aluminum indium nitride (AlInN).

Examples of materials of high refractive layer 14b include oxides such as niobium pentoxide ($Nb_2O_5$), titanium dioxide ($TiO_2$), titanium pentoxide ($Ti_3O_5$), zinc oxide (ZnO), zirconium dioxide ($ZrO_2$), tantalum pentoxide ($Ta_2O_5$), and cerium oxide ($CeO_2$); and nitrides such as aluminum oxynitride (AlON) and GaN.

Phosphor layer 15 has the function of converting the excitation light emitted from solid-state light sources 111a to wavelength converter into fluorescence.

Phosphor layer 15 includes sealing layer 15a made of transparent material, and phosphor particles 15b dispersed into layer 15a. Examples of the transparent material for layer 15a include glass resin, glass, and resin. In the present exemplary embodiment, glass resin is employed.

Instead of making it by dispersing phosphor particles into a transparent material, phosphor layer 15 may alternatively be a phosphor plate made by aggregating phosphor particles, or performing the sintering process. If phosphor layer 15 is a phosphor plate formed by attaching previously prepared phosphor layer 15 onto substrate 11, phosphor layer 15 can be sold and bought as a separate product.

Phosphor particles 15b are composed of at least one type of phosphor that absorbs excitation light in the UV to blue light region and emits fluorescence with a longer wavelength than the excitation light. In the present exemplary embodiment, solid-state light sources 111a are semiconductor lasers for emitting blue excitation light, and phosphor particles 15b are composed of a yellow phosphor. Exposed to the blue excitation light, phosphor particles 15b emits yellow fluorescence. The phosphor composing phosphor particles 15b may be a red or green phosphor instead of the yellow one. Furthermore, phosphor particles 15b may be composed of different kinds of phosphors whose emission spectra have different center wavelengths.

Examples of the yellow phosphor include $Y_3Al_5O_{12}:Ce^{3+}$, $(Sr, Ba)_2SiO_4:Eu^{2+}$, and $Ca_x(Si,Al)_{12}(O,N)_{16}:Eu^{2+}$. Examples of the red phosphor include $CaAlSiN_3:Eu^{2+}$, $(Ca,Sr)AlSiN_3:Eu^{2+}$, $Ca_2Si_5N_8:Eu^{2+}$, $(Ca,Sr)_2Si_5N_8:Eu^{2+}$, $KSiF_6:Mn^{4+}$, and $KTiF_6:Mn^{4+}$. Examples of the green phosphor include $Lu_3Al_5O_{12}:Ce^{3+}$, $Y_3(Ga,Al)_5O_{12}:Ce^{3+}$, $Ca_3Sc_2Si_3O_{12}:Ce^{3+}$, $CaSc_2O_4:Eu^{2+}$, $(Ba,Sr)_2SiO_4:Eu^{2-}$, $Ba_3Si_6O_{12}N_2:Eu^{2+}$, $(Si, Al)_6(O, N)_8:Eu^{2+}$, and $(Y,Lu)_3Al_5O_{12}:Ce^{3+}$.

The thickness of phosphor layer 15 and the average particle size of phosphor particles 15b are suitably determined to achieve phosphor layer 15 with high wavelength conversion efficiency. This will be detailed later.

Antireflective layer 16 has the function of reducing the reflection of the excitation light incident on layer 15, thereby improving the incident efficiency of the light on layer 15. Layer 16 further has the function of reducing the reflection of the fluorescence emitted from phosphor particles 15b on the surface of sealing layer 15a, thereby improving the extraction efficiency of the fluorescence from layer 15. Layer 16 is not essential in the present exemplary embodiment.

Layer 16 is formed in the entire region of metal reflective layer 13. Layer 16 is in contact with enhanced reflection layer 14 in the region of substrate 11 that is not covered with phosphor layer 15.

Antireflective layer 16 is a multi-layer film composed of alternately laminated high refractive layers and low refractive layers. In the present exemplary embodiment, layer 16 is composed of three layers: first low-refractive layer 16a, high refractive layer 16b, and second low-refractive layer 16c in this order from the substrate 11 side. Alternatively, however, layer 16 may include additional layers besides layers 16a to 16c as long as it is a multi-layer film composed of alternately laminated low and high refractive layers.

Examples of materials of first and second low-refractive layers 16a and 16c include oxides such as $SiO_2$ and $Al_2O_3$; and nitrides such as AlN, AlGaN, and AlInN. These low-refractive layers 16a and 16c may be made of the same or different materials from each other, or may be made of the same or different materials from low refractive layer 14a of enhanced reflection layer 14.

Examples of materials of high refractive layer 16b include oxides such as $TiO_2$, $Nb_2O_5$, $Ti_3O_5$, ZnO, $ZrO_2$, $Ta_2O_5$, and $CeO_2$; and nitrides such as AlON, and GaN. High refractive layer 16b of antireflective layer 16 may be made of the same or different materials from high refractive layer 14b of enhanced reflection layer 14.

Thicknesses of Phosphor Layers and Average Particle Size of Phosphor Particles

The thicknesses of phosphor layers and the average particle size of phosphor particles will now be described in detail. The term "average particle size" used in the present disclosure is generally called an "average particle size (D50)" or a "median diameter". The thickness of a phosphor layer means its average thickness.

Figure 3:
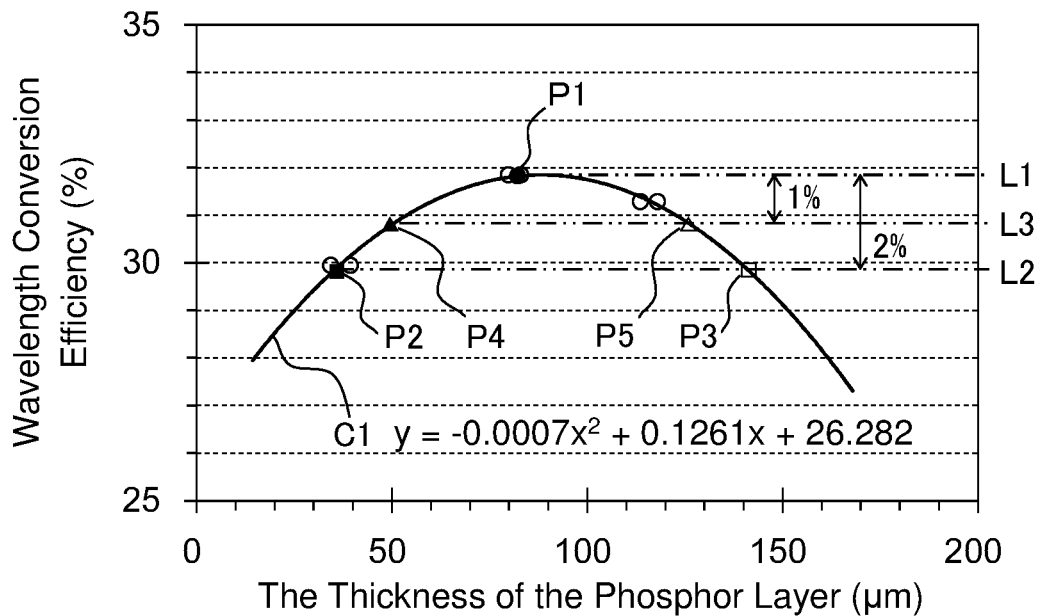
FIG. 3 is a graph showing the relationship between the thicknesses of phosphor layers and wavelength conversion efficiency when the phosphor particles have an average particle size of 9.2 μm.

FIG. 3 is a graph showing the relationship between the thicknesses of different phosphor layers and wavelength conversion efficiency when the phosphor particles have an average particle size of 9.2 μm. Six phosphor layers different in thickness were made of phosphor particles with an average particle size of 9.2 μm, and were measured for their wavelength conversion efficiencies. The measurement results are shown as ○ in FIG. 3.

The coordinates of the positions of ○ that are expressed to one decimal place are as follows: (34.4, 29.9), (39.4, 29.9), (79.9, 31.8), (83.0, 31.8), (113.6, 31.3), and (118.0, 31.3).

These six coordinates are plotted as an approximate curve C1, which is expressed by the formula: $y=-0.0007x^2+0.1261x+26.282$. The curve C1 has a coordinate P1 at which the wavelength conversion efficiency is maximum. The curve C1 also has a lower-limit coordinate P2 and an upper-limit coordinate P3, which are within −2% of the maximum wavelength conversion efficiency. The curve C1 also has a lower-limit coordinate P4 and an upper-limit coordinate P5, which are within −1% of the maximum wavelength conversion efficiency.

Figure 4:
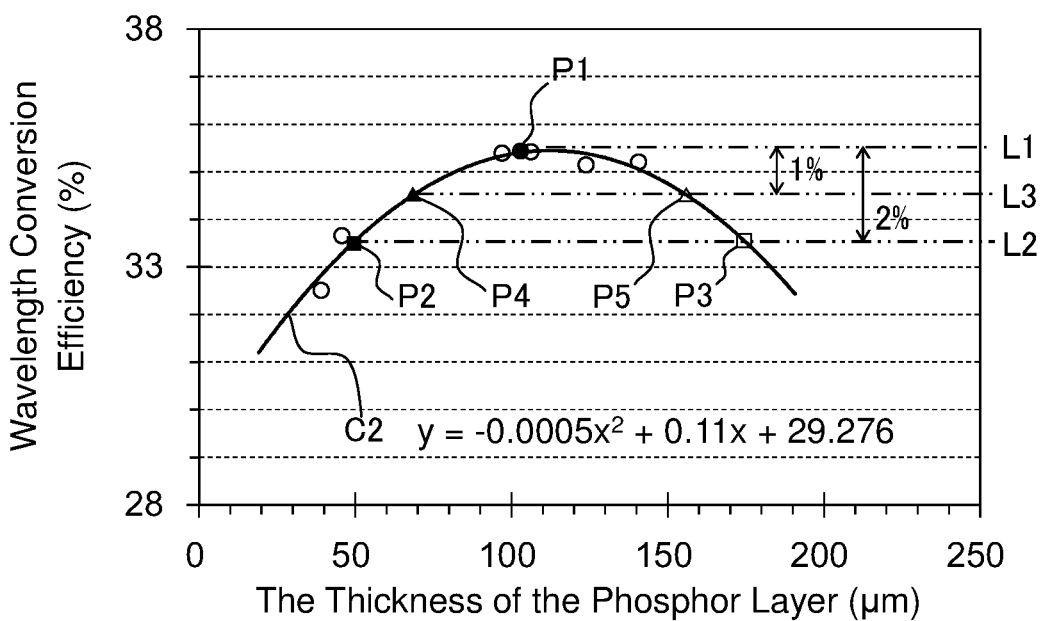
FIG. 4 is a graph showing the relationship between the thicknesses of phosphor layers and the wavelength conversion efficiency when the phosphor particles have an average particle size of 16.4 μm.

FIG. 4 is a graph showing the relationship between the thicknesses of different phosphor layers and wavelength conversion efficiency when the phosphor particles have an average particle size of 16.4 μm. Six phosphor layers different in thickness were made of phosphor particles with an average particle size of 16.4 μm, and were measured for their wavelength conversion efficiencies. The measurement results are shown as ○ in FIG. 4.

The coordinates of the positions of ○ that are expressed to one decimal place are as follows: (39.1, 32.5), (45.8, 33.7), (97.0, 35.4), (106.3, 35.4), (123.9, 35.1), and (0140.8, 35.2).

These six coordinates are plotted as an approximate curve C2, which is expressed by the formula: $y=-0.0005x^2+0.11x+29.276$. The curve C2 has a coordinate P1 at which the wavelength conversion efficiency is maximum. The curve C2 also has a lower-limit coordinate P2 and an upper-limit coordinate P3, which are within −2% of the maximum wavelength conversion efficiency. The curve C2 also has a lower-limit coordinate P4 and an upper-limit coordinate P5, which are within −1% of the maximum wavelength conversion efficiency.

Figure 5:
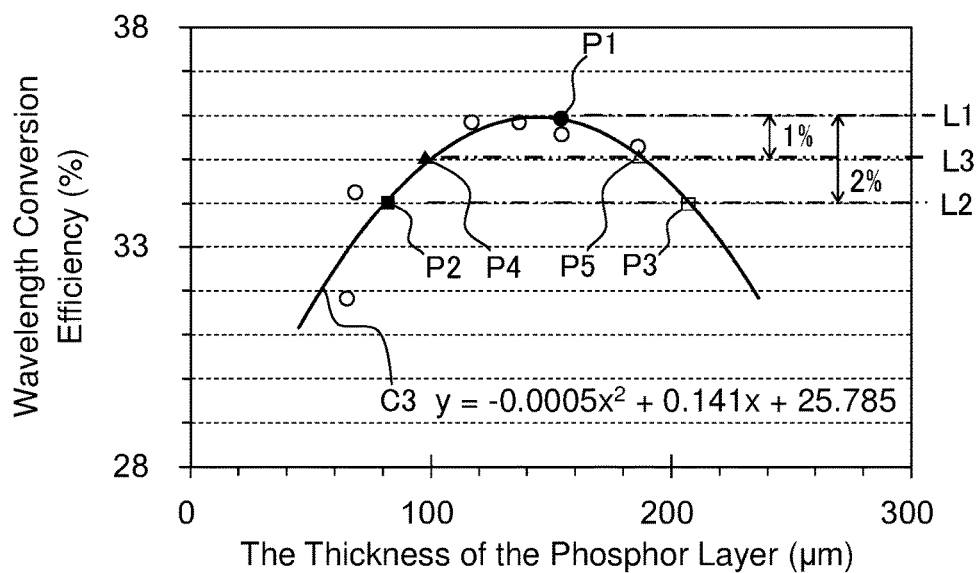
FIG. 5 is a graph showing the relationship between the thicknesses of phosphor layers and wavelength conversion efficiency when the phosphor particles have an average particle size of 29.7 μm.

FIG. 5 is a graph showing the relationship between the thicknesses of different phosphor layers and wavelength conversion efficiency when the phosphor particles have an average particle size of 29.7 μm. Six phosphor layers different in thickness were made of phosphor particles with an average particle size of 29.7 μm, and were measured for their wavelength conversion efficiencies. The measurement results are shown as ○ in FIG. 5.

The coordinates of the positions of ○ that are expressed to one decimal place are as follows: (65.1, 31.8), (68.5, 34.2), (117.0, 35.8), (136.8, 35.8), (154.5, 35.6), and (186.3, 35.3).

These six coordinates are plotted as an approximate curve C3, which is expressed by the formula: $y=-0.0005x^2+0.141x+25.785$. The curve C3 has a coordinate P1 at which the wavelength conversion efficiency is maximum. The curve C3 also has a lower-limit coordinate P2 and an upper-limit coordinate P3, which are within −2% of the maximum wavelength conversion efficiency. The curve C3 also has a lower-limit coordinate P4 and an upper-limit coordinate P5, which are within −1% of the maximum wavelength conversion efficiency.

As shown in FIGS. 3 to 5, it has turned out that the thickness of a phosphor layer greatly affects the wavelength conversion efficiency and has a peak at which the wavelength conversion efficiency is maximum. Too thin a phosphor layer cannot sufficiently wavelength-convert the excitation light. Meanwhile, too thick a phosphor layer cannot extract the wavelength-converted light efficiently from the phosphor layer. As a result, there is a peak in the wavelength conversion efficiency. This phenomenon is common to all kinds of phosphor particles. The volume density of the phosphor particles also affects the wavelength conversion efficiency of a phosphor layer, but hardly affects the peak value.

Figure 6:
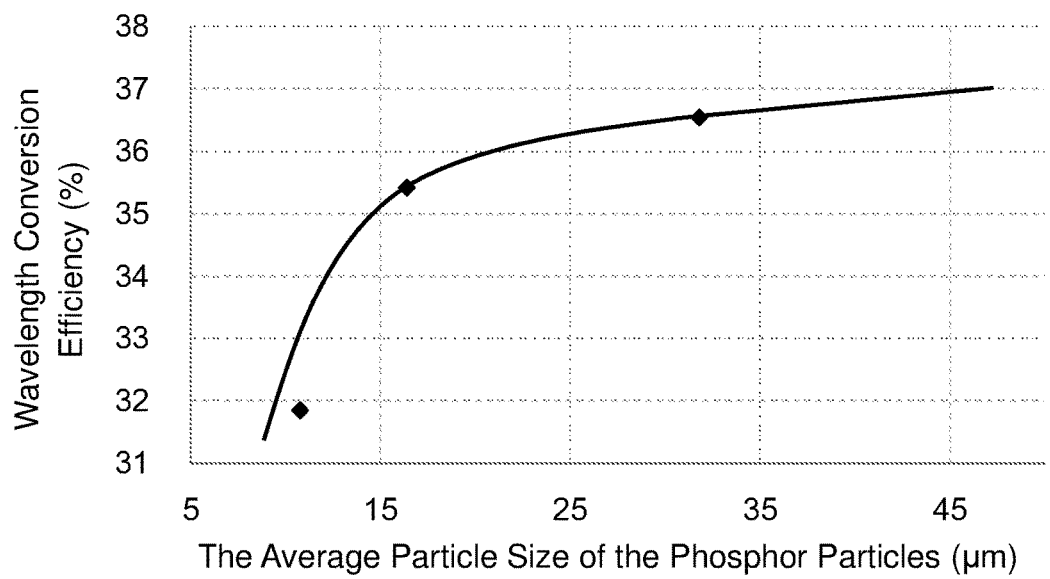
FIG. 6 is a graph showing the relationship between the average particle size of the phosphor particles and the wavelength conversion efficiency.

FIG. 6 is a graph showing the relationship between the average particle size of the phosphor particles and wavelength conversion efficiency. As shown in FIG. 6, the wavelength conversion efficiency increases with increasing average particle size of the phosphor particles. The reason for this is that an increase in the average particle size of the phosphor particles results in a decrease in the number of phosphor particle aggregates in the phosphor layer, and hence in the total of the surface area of the particle aggregates. This indicates a decrease in the area of the interface between the particle aggregates and the sealing layer, thereby reducing the scattering of the excitation light in the interface or in the phosphor layer. This improves light extraction efficiency, and hence, the wavelength conversion efficiency of the phosphor layer.

In phosphor layer 15 used in the first exemplary embodiment, glass resin is used as the transparent material of sealing layer 15a. When used as the transparent material, glass resin and resin are less likely to generate cavities in the gaps between the phosphor particles than glass. As a result, the wavelength conversion efficiency can be high.

As described above, the thickness of a phosphor layer and the average particle size of the phosphor particles greatly affect the wavelength conversion efficiency. Therefore, by controlling these two properties, it is possible to achieve a phosphor layer with high wavelength conversion efficiency.

Figure 7:
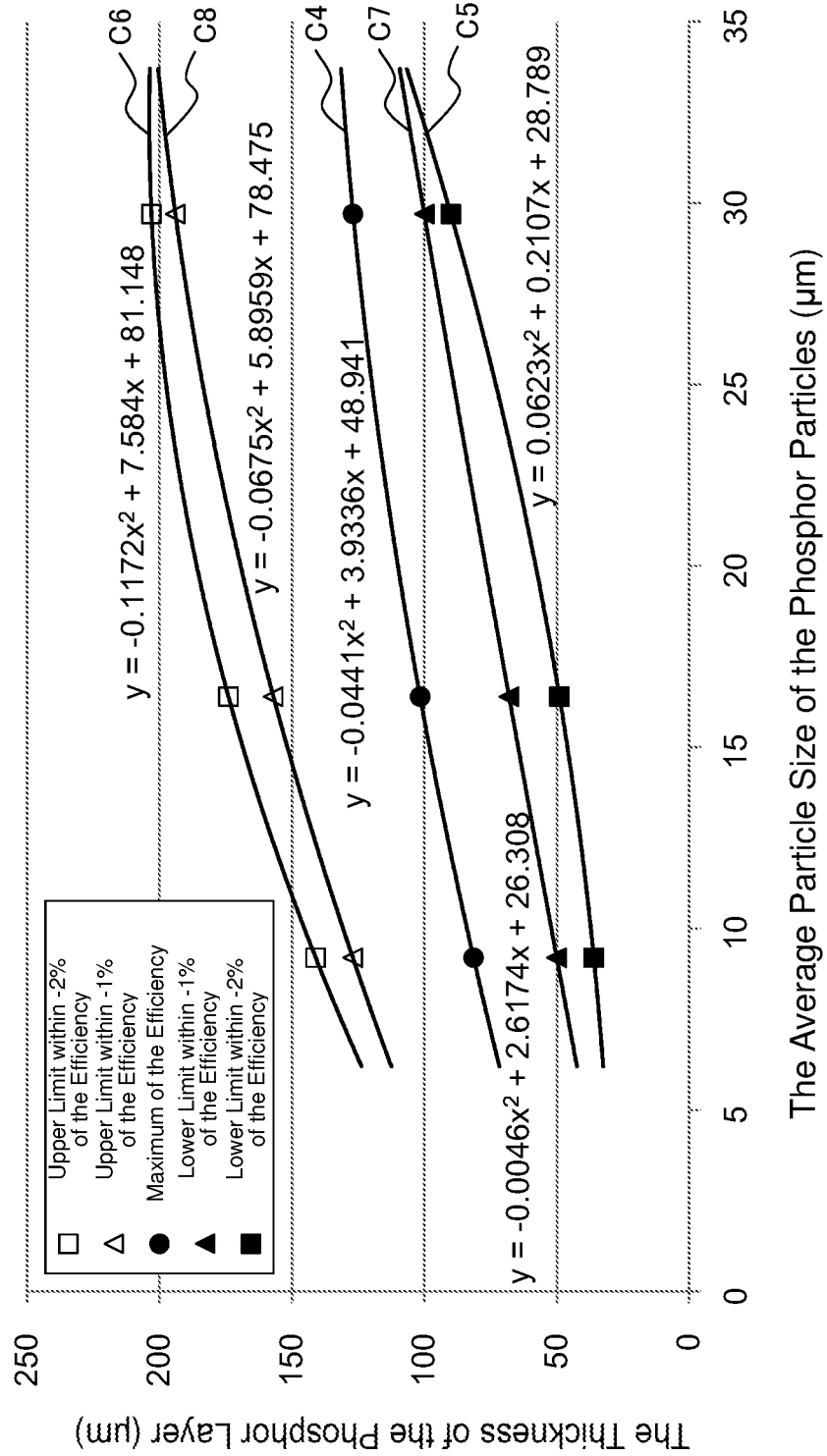
FIG. 7 is a graph showing the relationship between the average particle size of the phosphor particles and the thicknesses of phosphor layers.

FIG. 7 is a graph showing the relationship between the average particle size of the phosphor particles and the thicknesses of phosphor layers. In FIG. 7, the wavelength conversion efficiency is referred to simply as the efficiency.

As shown in FIG. 7, the coordinate P1 in each of FIGS. 3, 4, and 5 is plotted as an approximate curve C4, which is expressed by the formula: $y=-0.0441x^2+3.9336x+48.941$. When the thickness of a phosphor layer and the average particle size of the phosphor particles are both on the approximate curve C4, the phosphor layer has a maximum wavelength conversion efficiency.

The coordinate P2 in each of FIGS. 3, 4, and 5 is plotted as an approximate curve C5, which is expressed by the formula: $y=0.0623x^2+0.2107x+28.789$. The coordinate P3 in each of FIGS. 3, 4, and 5 is plotted as an approximate curve C6, which is expressed by the formula: $y=-0.1172x^2+7.584x+81.148$. When the thickness of a phosphor layer and the average particle size of the phosphor particles are both between the approximate curve C5 and the approximate curve C6, the phosphor layer has a wavelength conversion efficiency within −2% of its maximum value.

The coordinate P4 in each of FIGS. 3, 4, and 5 is plotted as an approximate curve C7, which is expressed by the formula: $y=-0.0046x^2+2.6174x+26.308$. The coordinate P5 in each of FIGS. 3, 4, and 5 is plotted as an approximate curve C8, which is expressed by the formula: $y=-0.0675x^2+5.8959x+78.475$. When the thickness of a phosphor layer and the average particle size of the phosphor particles are both between the approximate curve C7 and the approximate curve C8, the phosphor layer has a wavelength conversion efficiency within −1% of its maximum value.

The conclusions drawn from the above-mentioned results are as follows.

When the phosphor layer satisfies the relations: $y\geq 0.0623x^2+0.2107x+28.789$ and $y\leq -0.1172x^2+7.584x+81.148$, the phosphor layer has a wavelength conversion efficiency within −2% of its maximum value. As a result, the phosphor layer is estimated to have high wavelength conversion efficiency.

When the phosphor layer satisfies the relations: $y\geq -0.0046x^2+2.6174x+26.308$ and $y\leq -0.0675x^2+5.8959x+78.475$, the phosphor layer has a wavelength conversion efficiency within −1% of its maximum value. As a result, the phosphor layer is estimated to have higher wavelength conversion efficiency.

When the phosphor layer satisfies the relations: $y=-0.0441x^2+3.9336x+48.941$, the phosphor layer has a maximum wavelength conversion efficiency. As a result, the phosphor layer is estimated to have further higher wavelength conversion efficiency. The above relations are estimated to be satisfied when x is within ±1 μm, and y is within ±5 μm.

Projector 100

As a projector according to the first exemplary embodiment, projector 100 including wavelength converter 10 according to the first exemplary embodiment will now be described.

Figure 8:
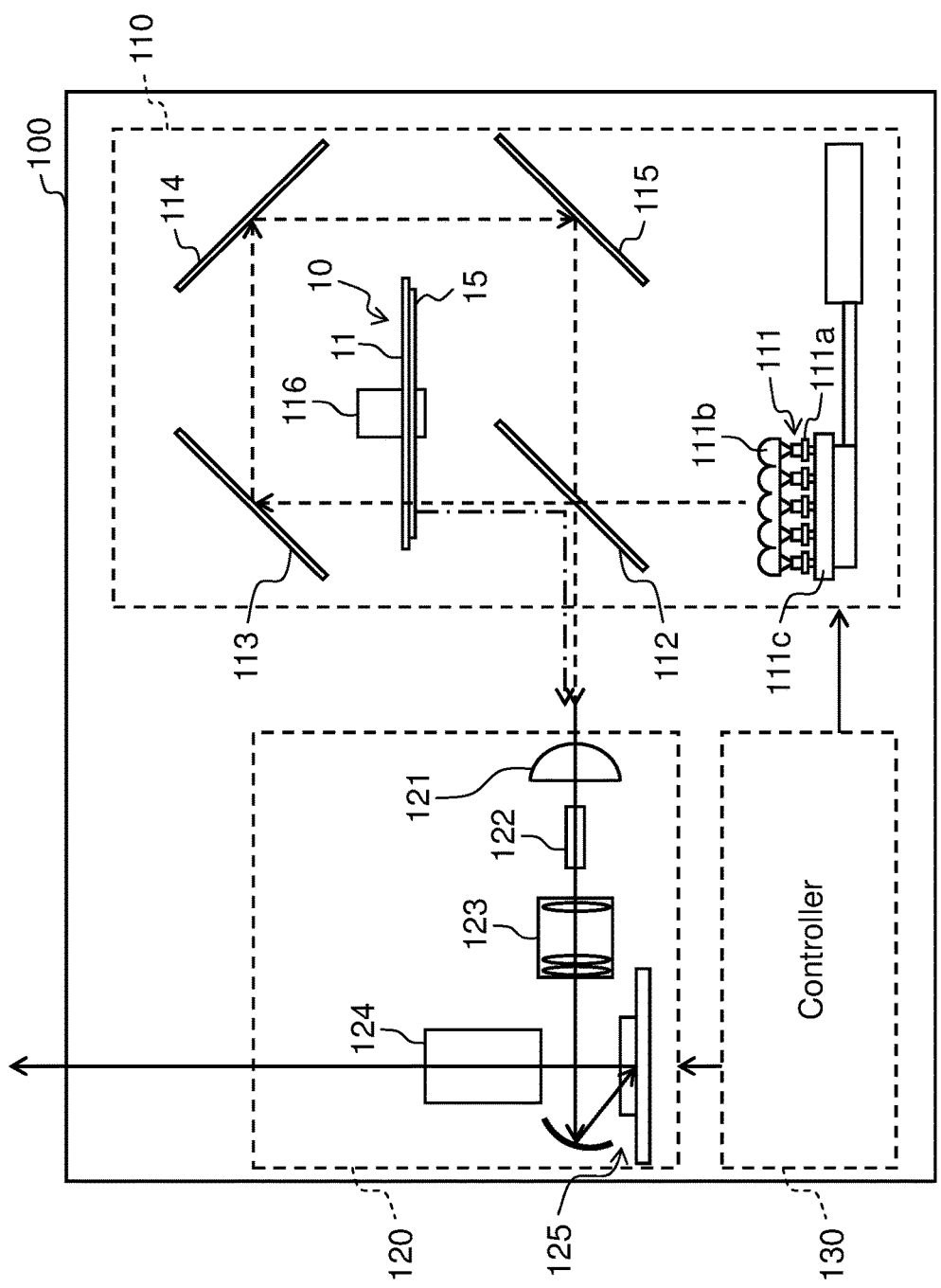
FIG. 8 is a diagram of a projector according to the first exemplary embodiment.

FIG. 8 is a diagram of projector 100 according to the first exemplary embodiment. As shown in FIG. 8, projector 100 includes light-emitting device 110, optical unit 120, and controller 130.

Light-emitting device 110 is the light source of projector 100. Device 110 includes wavelength converter 10, illuminator 111, dichroic mirror 112, first reflective mirror 113, second reflective mirror 114, and third reflective mirror 115.

Wavelength converter 10 is attached to and rotated by motor 116. Motor 116 is driven by a drive control signal from controller 130.

Illuminator 111 applies excitation light for exciting phosphor particles 15b to wavelength converter 10 from the phosphor layer 15 side. Illuminator 111 includes solid-state light sources 111a, and collimator lenses 111b for collimating the excitation light emitted from solid-state light sources 111a, and heat sink 111c.

Solid-state light sources 111a are, for example, semiconductor lasers or light emitting diodes. Light sources 111a are driven by a drive current and emit excitation light of predetermined color (wavelengths). In the present exemplary embodiment, light sources 111a are semiconductor lasers for emitting blue light with wavelengths between 360 nm and 480 nm, inclusive. The light emission from light sources 111a is controlled by controller 130. It is also possible to use a single light source 111a.

Dichroic mirror 112 has the property of transmitting the blue light (blue excitation light) emitted from illuminator 111, and reflecting light with a larger wavelength than the blue light. In short, dichroic mirror 112 reflects yellow light (yellow fluorescence) emitted from wavelength converter 10.

Optical unit 120 includes condenser lens 121, rod integrator 122, lens group 123, projection lens 124, and display device 125.

Condenser lens 121 collects the light from light-emitting device 110 onto the incident end surface of rod integrator 122.

Rod integrator 122 receives the light collected by condenser lens 121 at its incident end surface and emits the light with a uniform luminance distribution. Rod integrator 122, which is, for example, a square prism, repeats total reflection of the incident light in a medium and emits it as the light with a uniform luminance distribution.

Lens group 123 allows the light from rod integrator 122 to be incident on display device 125. Lens group 123 is a lens unit consisting of a plurality of lenses including, for example, a condenser lens and a relay lens.

Projection lens 124 is used for projecting the light from display device 125 to the outside of projector 100. Projection lens 124 is a projection lens group (projection unit) consisting of one or more lenses such as a biconvex lens, a diaphragm, and a plano-concave lens.

Display device 125 controls the light from lens group 123 and outputs it as images. One specific example of display device 125 is a digital mirror device (DMD) used as a video device.

Controller 130 controls light-emitting device 110 (illuminator 111 and motor 116), and display device 125. Specific examples of controller 130 include a microcomputer, a processor, and a dedicated circuit.

In the above-described projector 100, the blue light from illuminator 111 passes through dichroic mirror 112 and is incident on wavelength converter 10. In wavelength converter 10 that is being rotated by motor 116, a part of the blue light passes through substrate 11 by way of opening 11a, and another part of the blue light is converted into yellow light by phosphor layer 15.

The yellow light from phosphor layer 15 is reflected by dichroic mirror 112 and is led to optical unit 120. Meanwhile, the blue light that has passed through substrate 11 by way of opening 11a is reflected by first reflective mirror 113, second reflective mirror 114, and third reflective mirror 115 in this order. The blue light reflected by third reflective mirror 115 passes through dichroic mirror 112 and is led to optical unit 120. As a result, optical unit 120 receives white light produced from a combination of the blue light and the yellow light.

The white light incident on optical unit 120 passes through condenser lens 121, rod integrator 122, and lens group 123 in this order, and is incident on display device 125. The incident white light is formed into images (video light) based on a video signal from controller 130, and is outputted from display device 125. The images from display device 125 are projected onto a target such as a screen by projection lens 124.

As described above, the present disclosure has achieved projector 100 including wavelength converter 10. To be more specific, wavelength converter 10, which includes phosphor layer 15 with high wavelength conversion efficiency has achieved projector 100 with high luminosity.

Projector 100 according to the present exemplary embodiment is just an example, and phosphor layer 15 according to the present disclosure is usable in projectors including various existing optical systems.

Second Exemplary Embodiment

Phosphor Layer 25 and Wavelength Converter 20

Figure 9:
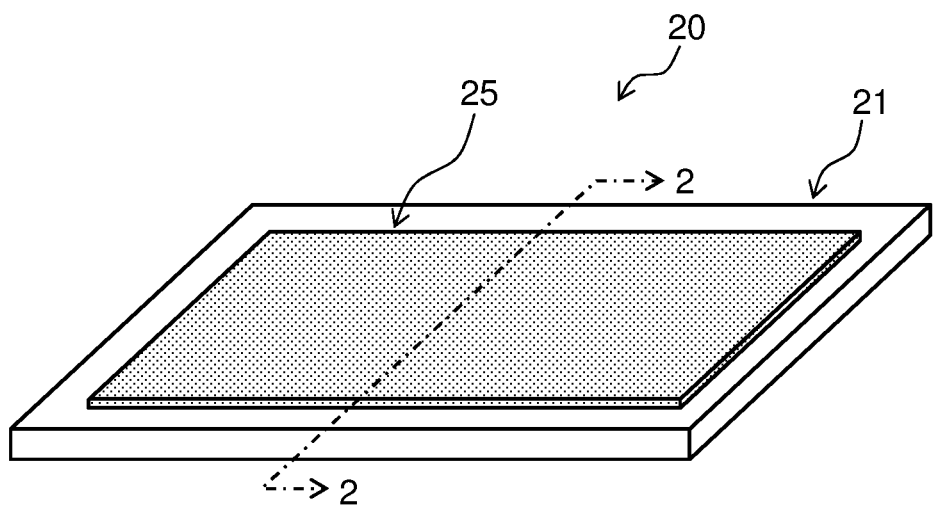
FIG. 9 is a perspective view of a phosphor layer and a wavelength converter according to a second exemplary embodiment.

FIG. 9 is a perspective view of phosphor layer 25 and wavelength converter 20 according to a second exemplary embodiment. In FIG. 9, wavelength converter 20 is intended for lighting devices, and includes substrate 21, an adhesive layer, a metal reflective layer, an enhanced reflection layer, phosphor layer 25 according to the second exemplary embodiment, and an antireflective layer. Substrate 21 is rectangular and is mounted with rectangular phosphor layer 25 on a main surface. Phosphor layer 25 is composed of a sealing layer and a phosphor.

All components in wavelength converter 20 are approximately identical to those of the same names in wavelength converter 10 according to the first exemplary embodiment except for their shapes. Therefore, the description of the components will be omitted. The cross sectional view taken along line 2-2 of FIG. 9 is identical to the cross sectional view taken along line 2-2 of FIG. 1.

Phosphor layer 25 has approximately the same structure as phosphor layer 15 according to the first exemplary embodiment. Therefore, layer 25 provides effects similar to those of layer 15 described above.

Lighting Device 200

Figure 10:
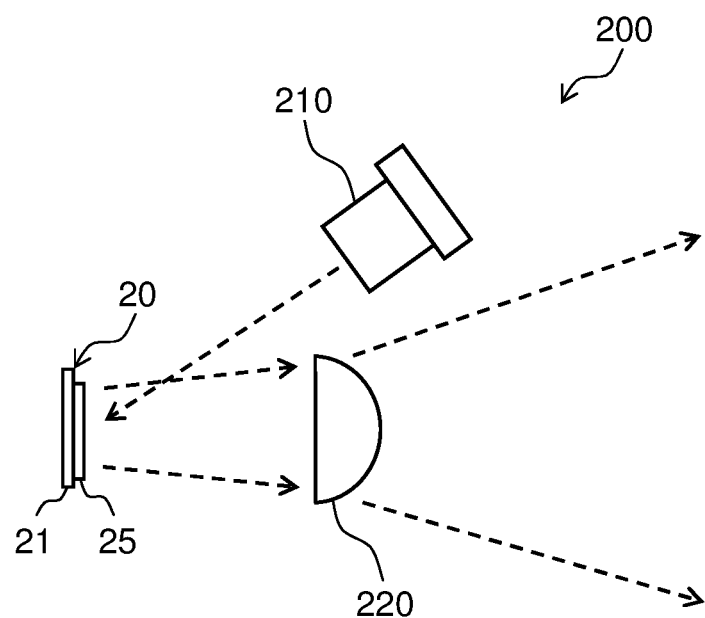
FIG. 10 is a diagram of a lighting device according to the second exemplary embodiment.

FIG. 10 is a diagram of lighting device 200 according to the second exemplary embodiment. In FIG. 10, lighting device 200 includes wavelength converter 20, solid-state light source 210, and optical system 220.

Specific examples of light source 210 include a semiconductor laser and a light emitting diode, which emit excitation light in the UV to blue light region. In the present exemplary embodiment, light source 210 is a semiconductor laser that is made of GaN-based material and emits blue light of about 460 nm.

The blue light (blue excitation light) emitted from light source 210 to wavelength converter 20 is partly converted into yellow light (yellow fluorescence) by phosphor layer 25. The yellow light from layer 25 and the blue light that has not converted by layer 25 are mixed and emitted as white light from wavelength converter 20. The white light is emitted as illumination light from optical system 220.

As described above, the present disclosure has achieved lighting device 200 including wavelength converter 20. To be more specific, wavelength converter 20, which includes phosphor layer 25 with high wavelength conversion efficiency has achieved lighting device 200 with high luminosity.

MODIFIED EXAMPLE

The phosphor layers, wavelength converters, projectors, and lighting devices according to the first and second exemplary embodiments have been described as above. However, the present disclosure is not limited to these embodiments, and includes any modifications that person skilled in the art may think of as long as they do not greatly deviate from the spirit of the present disclosure.

For example, in the first and second exemplary embodiments, the phosphor layers and the wavelength converters are intended for use in projectors and lighting devices; however, they may alternatively be used in displays and other devices.

The wavelength converters according to the first and second exemplary embodiments have the laminated structure shown in FIG. 2; however, other additional layers may be contained in the structure as long as the laminated structure provides similar functions.

The first and second exemplary embodiments have described only main materials of each layer of the laminated structure. Each layer can contain other additional materials as long as the laminated structure provides similar functions.

The phosphor layers and the wavelength converters according to the present disclosure can be widely used in devices that use wavelength-converted light, such as projectors and lighting devices.

REFERENCE MARKS IN THE DRAWINGS 10, 20 wavelength converter
11, 21 substrate
11a opening
12 adhesive layer
13 metal reflective layer
14 enhanced reflection layer
14a low refractive layer
14b high refractive layer
15, 25 phosphor layer
15a sealing layer
15b phosphor particles
16 antireflective layer
16a first low-refractive layer
16b high refractive layer
16c second low-refractive layer
100 projector
110 light-emitting device
111 illuminator
111a, 210 solid-state light source
111b collimator lens
111c heat sink
112 dichroic mirror
113 first reflective mirror
114 second reflective mirror
115 third reflective mirror
116 motor
120 optical unit
121 condenser lens
122 rod integrator
123 lens group
124 projection lens
125 display device
130 controller
200 lighting device
220 optical system

What is claimed is:

1. A phosphor layer comprising phosphor particles, the phosphor layer satisfying relations: $y \geq 0.0623x^2 + 0.2107x + 28.789$ and $y \leq -0.1172x^2 + 7.584x + 81.148$ where
   x represents an average particle size (μm) of the phosphor particles, and
   y represents a thickness (μm) of the phosphor layer.

2. The phosphor layer according to claim 1, further satisfying a relation: $y \geq -0.0046x^2 + 2.6174x + 26.308$.

3. The phosphor layer according to claim 1, further satisfying a relation: $y \leq -0.0675x^2 + 5.8959x + 78.475$.

4. The phosphor layer according to claim 1, further satisfying a relation: $y > -0.0441x^2 + 3.9336x + 48.941$.

5. The phosphor layer according to claim 1, further satisfying a relation: $y \leq -0.0441x^2 + 3.9336x + 48.941$.

6. A wavelength converter comprising the phosphor layer according to claim 1.

7. A projector comprising the wavelength converter according to claim 6.

8. A lighting device comprising the wavelength converter according to claim 6.

\* \* \* \* \*